United States Patent [19]

Van Dyk, Jr.

[11] Patent Number: 4,626,615
[45] Date of Patent: Dec. 2, 1986

[54] RF EXPANSION JOINT FOR AN ELECTRICALLY SEALED ENCLOSURE

[75] Inventor: Garritt C. Van Dyk, Jr., Bethel, Conn.

[73] Assignee: Keene Corporation, Norwalk, Conn.

[21] Appl. No.: 721,256

[22] Filed: Apr. 8, 1985

[51] Int. Cl.⁴ ............................................. H05K 9/00
[52] U.S. Cl. .............................................. 174/35 MS
[58] Field of Search .......... 174/35 R, 35 MS, 35 GL; 219/10.55 D

[56] References Cited

U.S. PATENT DOCUMENTS

| | | | |
|---|---|---|---|
| 3,074,520 | 1/1963 | Grubelich | 174/35 MS X |
| 3,589,070 | 6/1971 | Hansen | 174/35 MS X |
| 4,507,520 | 3/1985 | Lindgren | 174/35 MS |
| 4,525,595 | 6/1985 | Harriman | 174/35 GC |

Primary Examiner—Arthur T. Grimley
Assistant Examiner—D. A. Tone
Attorney, Agent, or Firm—Pennie & Edmonds

[57] ABSTRACT

An RF expansion joint for an electrically sealed enclosure having first and second wall members which are movable relative to each other. The joint includes guide means for maintaining the wall members in alignment during movement. The wall members each have a shielding material on their outer surfaces with a shield extension extending from the shielding of one wall member and overlying the shielding material of the adjacent wall member and an electrical sealing means is positioned between the extension and the shielding material over which it lies.

4 Claims, 2 Drawing Figures

RF EXPANSION JOINT FOR AN ELECTRICALLY SEALED ENCLOSURE

FIELD OF THE INVENTION

This invention relates to an RF expansion joint for an electrically sealed enclosure and more particularly to an enclosure made up of wall members which may move relative to each other due to temperature changes.

BACKGROUND OF THE INVENTION

Shielded enclosures or screen rooms are utilized to shield electrical equipment which may cause interference with other equipment as with radio receivers and the like. This is particularly true where the equipment may emit high frequency interference. Further screen rooms are used for security purposes where it is important that equipment contained within the room will not be subjected to "electronic eavesdropping".

Such rooms or enclosures may be fairly large and usually include shielding material, i.e. metal plate, extending over the interior and outer surfaces of wall members making up the room or enclosure. Because these metal plates may comprise a large area, they are subjected to appreciable thermal expansion and contraction due to temperature changes. Such relatively large thermal expansion and contraction may result in considerable relative movement in joint areas formed by adjacent plates in turn effecting R.F. seal integrity.

Any spacing in thermal expansion joints between adjacent wall members requires that an effective electrical seal be maintained between the shielding of adjacent wall members. Conventionally such a seal utilizes strips of finger stock material which comprises a plurality of adjacent curved metallic fingers which are connected at one end to a strip which is in turn connected to the shielding of one wall member while the curved portions of the fingers contact the shielding of an adjacent wall member. The result is that the fingers form an electrical seal between the shielding of the two wall members while at the same time allowing for relative movement between the two wall members. Such conventional strip material is generaly fragile and fingers comprising the finger strip material may be broken off or bent out of shape if movement between the wall members becomes misaligned. Specifically if the gap or spacing between the relative movable wall members due to any misalignment becomes too great, the fingers may not be able to expand sufficiently to contact the shielding of an opposite wall member, or if due to misalignment the spacing between two wall members becomes too narrow, the fingers may be crushed or torn away. In either event the effectiveness of the RF shield is diminished.

It is therefore an object of my invention to provide for an RF expansion joint between two relatively movable wall members which will assure that the wall members will always remain in proper alignment to prevent any impairment of an electrical seal between the two members because of destruction of the seal material or due to failure of the seal material to contact the shielding material of the two wall members because of misalignment.

GENERAL DESCRIPTION OF THE INVENTION

Broadly, an RF expansion joint according to my invention is for use with adjacent wall members which are movable relative to each other and each of which has shielding material, i.e. metallic plate, on at least one outer surface. A first guide means is included on an end face of a first wall member while a second guide means is included on an end face of a second wall member with both guide means being adapted to engage with each other to align the wall members throughout a range of movement relative to each other. An extension of the shield on the first wall member adjacent the end face having the first guide means is adapted to overlie the end face of the second wall member having the second guide means. An electrical sealing means is positioned between the extension and the shielding on the second wall member to insure an RF seal between the two wall members.

Preferably the first guide means comprises a groove and the second guide means comprises a tongue which is slidably received by the groove.

The sealing means may comprise a first plurality of conventional metallic curved contact fingers which are connected to either the extension of the shielding of the first wall means or to the shielding of the second wall means. The curved portion of the fingers engage the shielding of the second wall member when they are fastened at one end to the extension, or in the alternative, they may engage the shielding when one end is attached to the shielding of the second wall member.

Preferably a further plurality of metallic curved contact fingers is positioned so that each finger will overlap adjacent edges of adjacent fingers of the first plurality of fingers and these further fingers are connected to the same structure as the first plurality of fingers, that is if the first plurality of fingers is connected to the extension, then the second plurality of fingers would be connected to the same extension or both would be connected to the shielding of the second wall member.

DESCRIPTION OF THE PREFERRED EMBODIMENT

Figure 1:
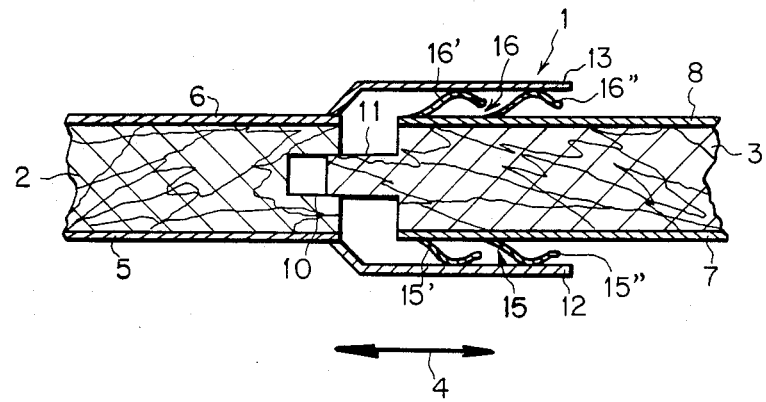
FIG. 1 is a cross-sectional view of an RF expansion joint constructed according to the invention.
Figure 2:
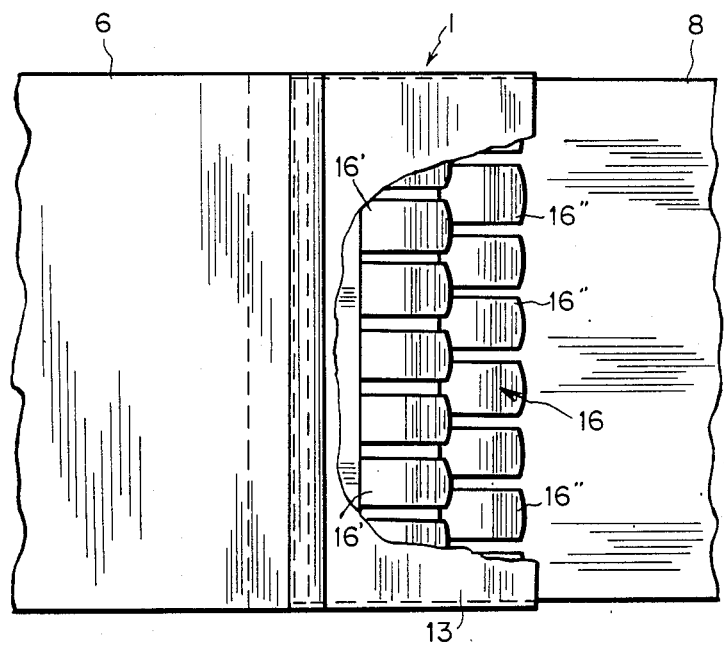
FIG. 2 is a partial broken plan view of the RF expansion joint of FIG. 1.

Referring to FIGS. 1 and 2, there is illustrated an RF expansion joint 1 constructed according to the invention joining a first wall member 2 and a second wall member 3 which are movable relatively towards and away from one another in the direction of the arrow 4. Wall member 2 has shielding material in the form of electrically conductive metal plates 5 and 6 on both sides thereof while wall member 3 has similar plates 7 and 8 on both sides thereof.

Wall member 2, which may be considered a first wall member, has a first guide means in the form of a groove 10 on an end face thereof while wall member 3, which may be considered a second wall member, has a second guide means in the form of a tongue 11 on an end face thereof which is slidably received in the groove. This sliding arrangement between the tongue and groove maintains alignment between the wall members 2 and 3 when the members move relative to each other in the direction of the arrows 4.

While the drawings show the first wall member having a guide means in the form of a groove, it is apparent that the first guide means could comprise a tongue in which event the second guide means on the second wall member would comprise a groove. Further while only one tongue-groove arrangement is disclosed, the cooperating guide means could comprise a plurality of grooves and tongues or could even comprise other forms, for example, pins on the end face of one wall member slidably received in holes in the end face of the other wall member.

The RF expansion joint further comprises an extension 12 of a shielding material and extension 13 of a shielding material both of which overlie the end face of the second wall member 3 and which are electrically connected to plates 5 and 6 respectively. Instead of the extensions 12 and 13 being formed as separate pieces, they could in the alternative be integral with the plates 5 and 6.

An electrical sealing means 15 is positioned between the extension 12 and plate 7 while a further sealing means 16 is positioned between extension 13 and plate 8 to insure an RF seal in the spaces between the plates and extensions. As shown sealing means 15 and 16 each comprise a first plurality of electrically conductive metallic curved spring contact fingers 15' and 16' each of which are connected at one end to plates 7 and 8 respectively and each of which slidingly contacts a surface of extensions 12 and 13 respectively.

Preferably each sealing means 15 and 16 includes a second plurality of curved spring contact fingers 15" and 16" which overlap adjacent edges of the first plurality of fingers to assure that there is no RF leakage between the first plurality of fingers.

While the fingers are shown in FIGS. 1 and 2 as being connected at one end to plates 7 and 8, they could instead be connected at one end to the extensions 12 and 13 in which event the curved portions would slidingly engage the plates 7 and 8.

It is seen that the guide means comprising the groove 10 and tongue 11 will assure straight line relative movement between wall members 2 and 3 to maintain the members in alignment and to assure that the spacing between the extensions 12 and 13 and plates 7 and 8 remains constant. Such constant spacing and alignment prevents any crushing of the fingers 15', 15", 16' and 16" caused by the spacing being decreased or any loss of effectiveness of the fingers contacting a plate caused by the spacing being increased.

While I have disclosed a sealing means in the form of curved contact fingers, other sealing means would be applicable for use with an expansion joint constructed according to the invention, i.e. metallic screening or sponge-like material.

I claim:

1. An RF expansion joint for an electrically sealed enclosure comprising first and second adajcent relatively movable wall members movable along a predetermined linear path, shielding material on at least one outer face of each said wall member, a first guide means on an end face of said first wall member extending along said linear path and parallel thereto, a second guide means on an end face of said second wall member extending along said linear path and parallel thereto and adapted to engage with the first guide means to align said wall members for linear movement throughout a range of movement relative to each other along said linear path, an extension to the shielding on said first wall member adjacent the end face having said first guide means, extending along said linear path and overlying the end face of the second wall member having said second guide means, and electrical sealing means, separate from said guide means, extending between said extension and the shielding on the second wall member.

2. An RF expansion joint according to claim 1 wherein said second guide means comprises a tongue and said first guide means comprises a groove adapted to slidingly receive said tongue.

3. An RF expansion joint according to claim 2 wherein said sealing means comprises a first plurality of metallic curved spring contact fingers having one end connected to either of the extension or the shielding on said second wall member and the curved portion of the fingers engaging either said extension or the shielding of the second wall member.

4. An RF expansion joint according to claim 3 having a second plurality of metallic curved spring contact fingers having one end connected to the same structure as said first plurality of curved spring contact fingers and with the seocnd plurality of fingers overlapping adjacent edges of adjacent fingers of said first plurality of fingers.

* * * * *